United States Patent [19]

Chasek

[11] Patent Number: 5,894,422
[45] Date of Patent: Apr. 13, 1999

[54] SYSTEM AND METHODS THAT FACILITATE THE INTRODUCTION OF MARKET BASED ECONOMIC MODELS FOR ELECTRIC POWER

[76] Inventor: Norman E. Chasek, 24 Briar Brae Rd., Stamford, Conn. 06903

[21] Appl. No.: 08/789,097

[22] Filed: Jan. 27, 1997

[51] Int. Cl.⁶ .................................................. H02J 13/00
[52] U.S. Cl. .................. 364/528.26; 364/528.3; 702/61; 702/62; 340/870.03
[58] Field of Search .................... 364/492–495, 364/483, 480, 481, 802, 550, 551.01, 578–580, 528.21, 528.26, 528.27, 528.29, 528.3, 528.31, 528.32; 324/111, 113–116, 140 R, 141, 142; 340/500, 539, 870.02, 870.03, 825.72; 705/412; 702/57–62, 64, 65, 68, 79, 119, 120, 122, 123, 125, 176–179, 185, 187–189; 361/42, 62, 64–66, 68, 74, 78–81, 86, 87, 89, 94

[56] References Cited

U.S. PATENT DOCUMENTS 4,322,842  3/1982  Martinez ..................... 340/825.72
5,056,107  10/1991  Johnson et al. ................ 340/870.03
5,448,230  9/1995  Schanker et al. ............... 340/870.03
5,495,239  2/1996  Ouellette ..................... 340/870.02

Primary Examiner—Hal Dodge Wachsman

[57] ABSTRACT

A smart meter/billing system that eases the transition to commodity-like marketplace operations for electric power, and supports near real-time load balancing between competing suppliers of electric power. Existing watt-hour meters become multi-parameter terminals or smart meters that measure consumption per unit of time correlatible to calendar-time, measure near real-time demand, measure reliability, store information and transmitting it to a smart meter reader when properly interrogated. The smart reader periodically sends its accumulated information to a billing computer. An optional ancillary system uses the same smart meters to support automatic load balancing between competing suppliers that share common distribution facilities. Supplier designated demand increments from possibly millions of consumers, are summed according to the supplier-of-record, over near real-time intervals. These sums are used by the suppliers to adjust their output power so it equals the actual, near real-time demand of their customers-of-record at any time.

10 Claims, 3 Drawing Sheets

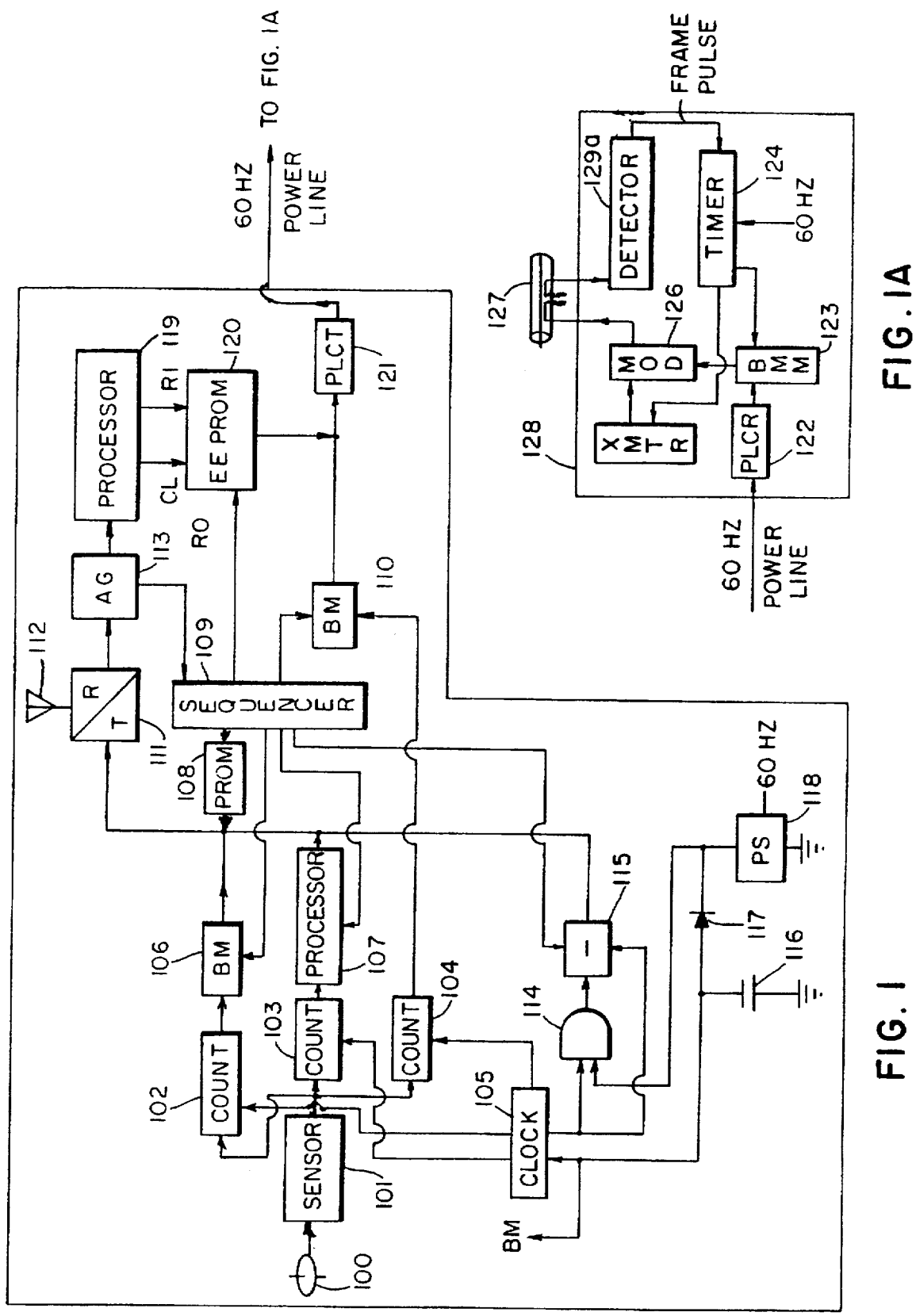

5,894,422

SYSTEM AND METHODS THAT FACILITATE THE INTRODUCTION OF MARKET BASED ECONOMIC MODELS FOR ELECTRIC POWER

BACKGROUND OF THE INVENTION

A vast economic restructuring of the public's electric power supply system is beginning to take place. The restructuring involves replacing the present regulated, fixed price non-competitive economic model by one in which price is determined by market forces. An objective for deregulating electricity should be to put in motion a process that results in the smooth transition from the present regulated status to deregulated markets that resemble, in function, those that exist for most other economic commodities. The integrated marketplace that now exists for many commodities is clearly a most efficient one. A goal for electricity should be to include as many of the aspects that contribute to that efficiency, as is practical for electricity, a commodity that is difficult to store.

Commodity economics requires that prices reflect supply & demand tensions, competitive pressures, quality of product, as well as the cost to produce it. The supply & demand situation is always changing for electricity so its price should fluctuate to counter the potential for excessive supply & demand imbalance. Since electricity must generally be consumed the moment it is produced and is a vital lifeline service, imposing a commodity regime onto the delivery of electricity poses special problems. One approach to pricing electricity commodity style is described in U.S. Pat. No. 5,237,507.

What seems clear now is that there is no surefire approach to making electricity into a practical market-based commodity. Hence any new metering infrastructure being considered should have flexibility to support a number of possible advanced economic models. An approach now being taken to introduce competition would leave the existing metering infrastructure untouched and would achieve consumer choice through a corporate restructuring that separates existing utility generator assets from its other assets and would encourage competitors to enter by giving them the right to share existing Transmission & Distribution (T&D) facilities.

Sharing T&D requires some form of load balancing or apportionment of load among the competing suppliers, depending on the demand of all their customers of record. The method generally being suggested for achieving this relies on an independent system operator and uses historic load profiles from which the typical demand for each competitor's customers is projected for every hour of every day. However the use of historic load profiles to anticipate real-time demand for load balancing between intense competitors, that must share common T&D facilities, is fraught with unpredictable negative possibilities, particularly if prices were to fluctuate hourly, as they would in any advanced economic model.

Implementing true real-time load balancing based on the actual near real-time demand of each supplier's consumers of record would be desireable, if it could be done at reasonable cost. Such an approach would put less reliance on the need for skilled central management by an independent system operator and more on free market forces to keep prices honestly competitive.

SUMMARY OF THE INVENTION

An illustrative example of a smart meter adapter block diagram shows how this smart meter can be realized for customers that have spinning disc watt-hour meters. This smart meter adapter will be packaged to fit within the watt hour meter's glass enclosure. It accumulates rotating disc counts for every consecutive one hour period over the meter-read cycle. Each hourly count is stored in the smart meter in order of arrival. The smart meter reader tags each meter's monthly batch of hourly-counts with a calendar-time tag which indicates when that interrogation occurred, so that each hourly count can later be related to its exact calendar-time of occurrence in the central billing computer, which uses this information to calculate bills even when the price fluctuates hourly. The sum of hourly counts taken over the entire meter-read cycle represents total KWHs consumed for the billing period. This is useful information for a smart meter phase-in period.

The one minute count number available from the smart meter is used to support near real-time load balancing provided through an ancillary add-on system. That count number is tagged with a consumer choice-of-supplier code stored in each smart meter. The resulting information is referred to as a demand message. To support load balancing in near real-time, each demand message is transferred to a remote terminal on the consumer's premises, where it is processed for insertion into a cable-TV transmission line that would be shared with tens of thousands of other consumers. The demand message processing involves reading a demand message into a memory, and reading it out in a time compressed burst that is coincident in time with that consumer's uniquely assigned time slot. The narrowed demand message modulates a RF carrier which is fed into a cable TV feeder-line leading to a transmission line.

That transmission-line carries each consumer's demand message to a terminal-point where the demand numbers are separated out from each demand message and summed in a supplier-dedicated register that is selected by the accompanying supplier code. Each sum represents the near real-time, aggregate demand being placed on each competing supplier by all its consumers, along a given cable run,every minute. Each minute's sum is then transmitted to its supplier designated generator site, where each supplier's sum received from many terminal-points throughout the power system, are combined into a grand sum to indicate total minute-by-minute demand being placed on a given supplier's generator site by all the consumers in the system who selected that supplier for that month. The grand sum's magnitude is used to adjust a generator's voltage to make the power flowing from that generator equal to the demand of all its consumers of record, minute-by-minute. This accurately apportions the load between independent generators sharing a common T&D facility. It is pointed out that the smart meter, remote terminal, transmission line complex can become its own fault detection and localization system.

BRIEF DESCRIPTION OF THE DRAWINGS

The various aspects and advantages of this invention will be more fully understood from a consideration of the following detailed description in conjunction with the accompanying drawings, in which.

Figure 1B:
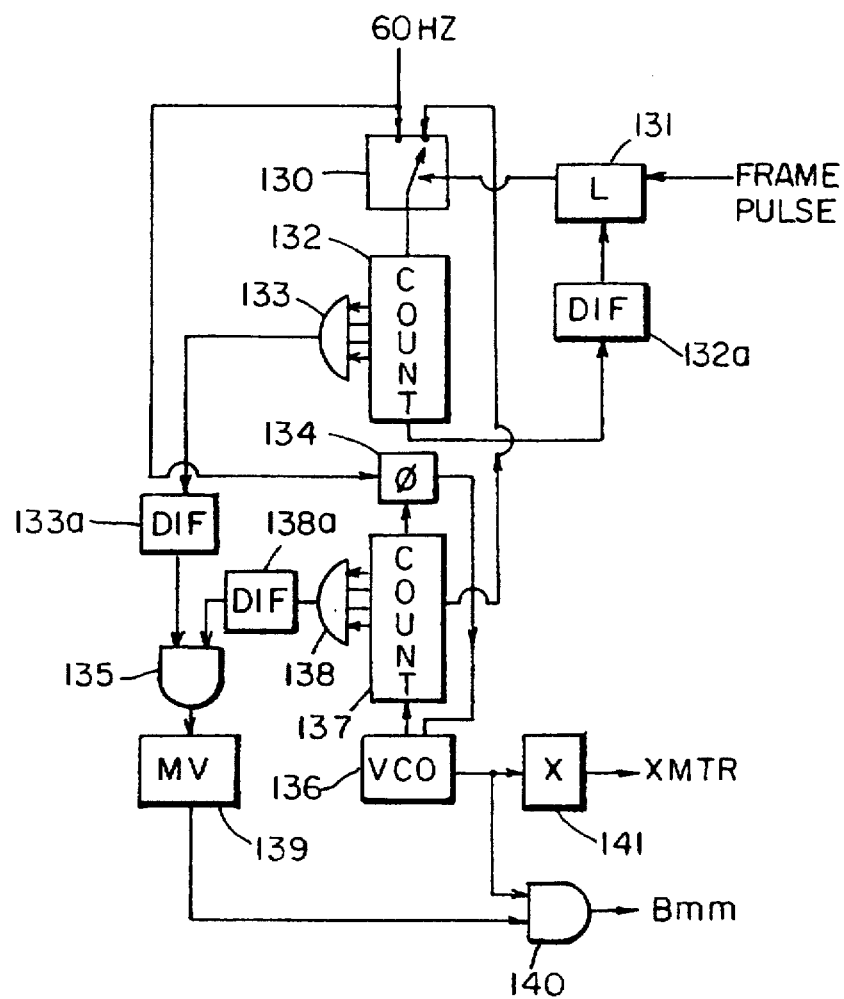
FIG. 1 illustrates, in block diagram form, the component parts of a smart meter adapted watt-hour meter that receives rotation information from the watt-hour meter's spinning disc, processes it, and delivers the processed information via RF carrier to a remote terminal and via radio to a smart meter reader.
FIG. 1A shows, in block diagram form, a preferred remote terminal used for relaying the near real-time demand & selected supplier information received from the smart meter onto a common transmission-line.

FIG. 1B illustrates a method for timing the insertion of compressed-time demand-messages onto a transmission-line.

Figure 2A:
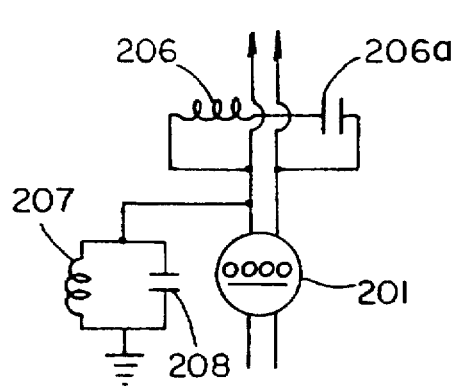
Figure 2:
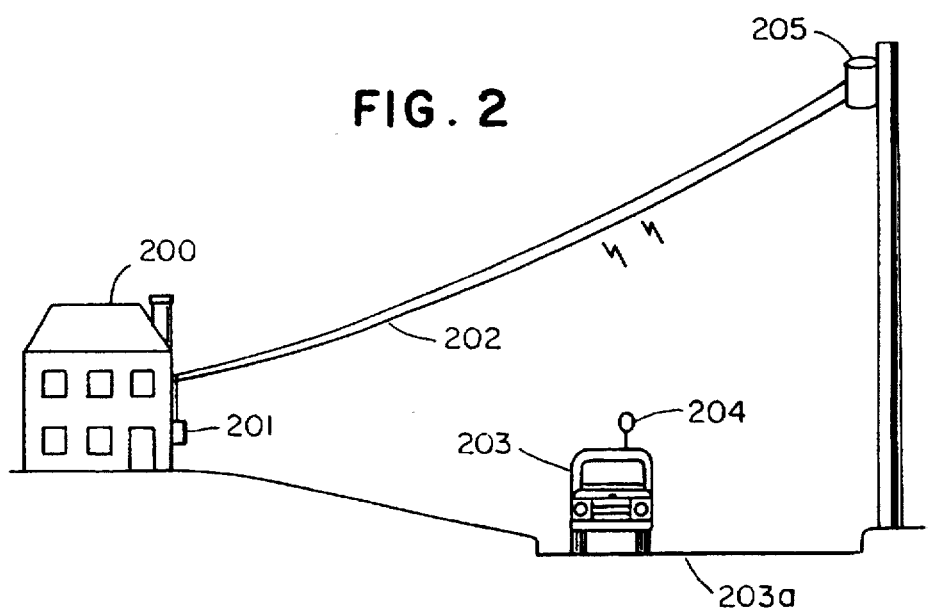

FIG. 2 pictorially illustrates a preferred method by which the smart meters can be remotely interrogated by radio signals emanating from a smart meter and smart meter reader.

FIG. 2A illustrates how a consumer's power feedline is adapted so that it would also serve as a fairly efficient RF radiating-line that transfers information between the smart meter and a passing, smart meter reading, vehicle mounted receiver-transmitter.

Figure 3B:
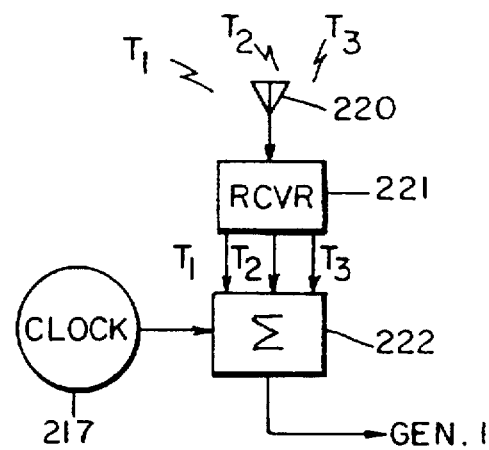
Figure 3A:
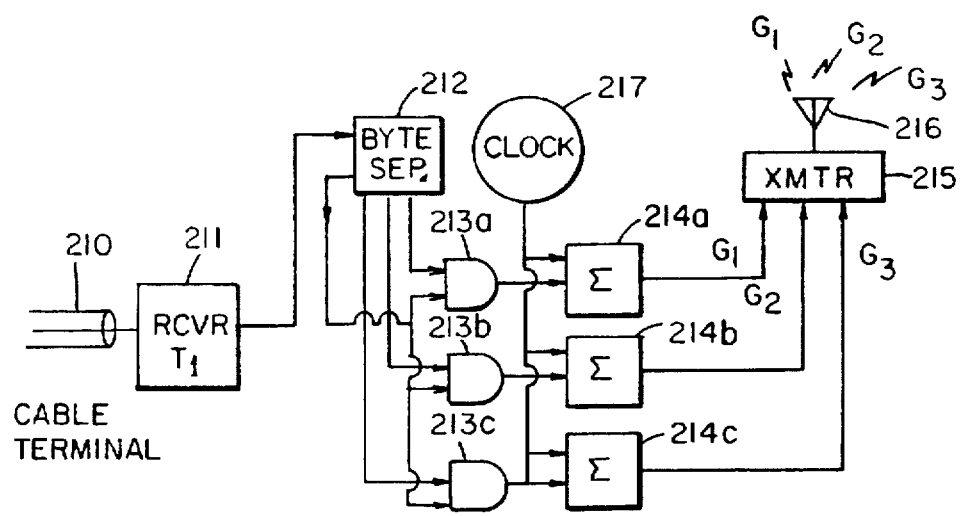

FIG. 3A illustrates the transmission-line terminal point functions which sort and sum near-real-time demand numbers collected from a given transmission line run and destined for each competing supplier's generator site FIG. 3B illustrates means at a given supplier's generator site for determining grand sum totals received from several terminal points at any given supplier's generator site.

Figure 3C:
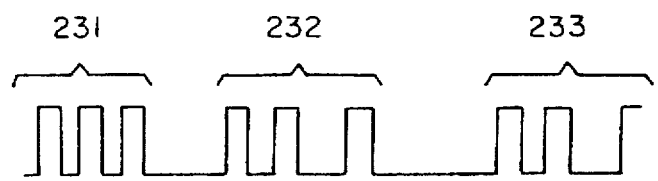

FIG. 3C illustrates a demand message format.

INTRODUCTION TO THE INVENTION

This invention describes a systems approach to implementing a transition from selling electricity into regulated, fixed price, non-competitive markets eventually to selling it into markets that resemble those that bring other commodities from their sources to their mass consumers. It describes a system consisting of smart meters, smart meter-readers and a billing computer that support progressively advancing economic models for billing customers. Existing watt-hour meters would be converted into smart meters. Once converted the meters would support billing with time variable pricing, with reliability factors, and near real-time load balancing, thought to be pivotal to efficient, honest competition.

The transition would start with smart meter adapters being inserted into existing watt-hour meter's enclosures, keeping the watt-hour meter intact. Since smart meter information will support billing by a flat, fixed rate, there can be dual metering available for this billing, greatly facilitating installation and testing of a smart meter system. The smart meter's information supports a transition to flexible choice-of-supplier competitive modes at any time. Otherwise an early transition could be to introduce a reliability factor in pricing. An intermediate transition might be to introduce fixed calendar-time-of-use rates. Next could be the introduction of near real-time load balancing, replacing historic load profiles. A last transition would be the full commoditization of electric power, which involves relating hourly prices to supply & demand.

DETAILED DESCRIPTION OF THE INVENTION

The format used in FIG. 1B is referred to as a hard-wired logic format. It can also serve as an algorithm for developing software needed to program a micro-processor implementation of the apparatus so illustrated.

Referring to the drawings, FIG. 1 illustrates a watt hour meter adapter unit which would fit within the typical watt-hour meter's glass enclosure, converting the standard watt hour meter into a smart meter. Spinning disc 100 is part of an electromechanical watt-hour meter. Sensing device 101 indicates one rotation of disc 100 by producing a pulse for each full rotation. Counters 102, 103 and 104 count these pulses over differing time durations. Two counters are readout by two different timing outputs from clock 105 and their counts are stored in buffer memory 106 and in processor 107 respectively.

The readouts of memory 106 and processor 107 is activated by receipt of a correct address code from a smart meter reader, which when received opens address gate 113 which activates sequencer 109 to issue four sequenced commands. The first command would read-out an accumulated hourly count from buffer memory 106 in the reverse order that the count was read in. This information when received by the smart reader is tagged with a calendar-time generated in the smart reader. This hourly data stream plus calendar-time tag is stored in a smart reader memory until it can be transferred out to a central billing computer. The computer is programmed to tag each hour's meter count with its specific calendar-time so when each hour's billing rate is determined, it will be multiplied by both that hour's count and by a numerical constant that relates that count to watt-hours of energy consumption.

The second command reads-out a number stored in processor 107. This number indicates the extent to which that consumer has drawn more energy during any 15 minute interval than the drop transformer is rated for. The third command reads-out accumulated differences from running difference counter 115. The accumulated differences collected over a year become a measure of power reliability. The fourth command reads-out the customer's identification code stored in PROM 108.

Counter 102 typically counts pulses for one hour which will be the pricing period used in this illustrative example. Clock 105 triggers the transfer of each hourly count to buffer memory 106 and then clears that counter. Each hourly count, in its sequence, is stored in memory 106 which is read out once per month into low power radio transmitter 111a, after a read-out command is received by receiver 111b from the smart meter reader. R/T 111 feeds common antenna 112 to communicate with the smart meter reader.

Counter 103 counts pulses received from sensor 101 over 15/n minute sliding time increments. Processer 107 sums the count over each sliding 15 minute interval and scans each count looking for 15 minute sums that exceed a given numerical quantity. When the count exceeds that quantity, this indicates the rated maximum of that consumer's feed has been exceeded. All excess differences are summed over the monthly meter reading period in processor 107. The magnitude of that sum could be used to prioritize remedial policing action.

Counter 104 continuously counts pulses for one minute durations which will be the assumed near real-time interval. The count is transferred to memory 110 where it is stored briefly until readout on signal from continuously-on sequence timer located in sequencer 109. This timer sequentially readsout memory 110 and EEPROM 120 once per minute. EEPROM 120 indicates the current consumer-selected supplier of power. The two linked numbers are called a "demand message". This demand message modulates RF transmitter 121, which uses the consumer's 110 VAC wiring to transfer demand messages to remote terminal 128, which is attached to a 110 VAC outlet closest to a cable TV feed.

The consumer can change suppliers every month if he or she so chooses. Then a choice-of-supplier code is entered into the billing computer along with the consumer's ID code. The chosen supplier's code is also read into processor 119 preceeded by a request-to-change code which initiates the erasure and replacement of the previous supplier's code from EEPROM 120. The replacement process is initiated by a secure smart meter reader command, received in address gate 113, which temporarily opens allowing the initiation of sequencer 109 in its series of sequenced readouts which includes a readout of EEPROM 120. The open gate also allows a request-to-change to feed into processor 119. This code originates in the smart meter reader. A request-to-change code activates the following processor sequence: Erasure of the existing supplier's code from EEPROM 120 and insertion of the new supplier's code, which also comes from the smart meter reader.

The reliability of the electricity delivered can be determined by splitting an output from clock 105 into two arms with one arm feeding thru coincidence gate 114 to one input of an and-gate located in running-difference counter 115, and the other arm fed directly to a second input of that and-gate in counter 115. Difference counter 115 counts the output pulses from clock 105 fed to it 1) directly and 2) thru coincidence gate 114. Gate 114 is open whenever the DC voltage from the unregulated portion of power supply 118 is above a threshold level. This allows the pulses from clock 105 to pass into counter 115, otherwise no pulses pass. DC source 118 is powered by the 110 VAC line and is isolated from standby battery 116 by diode 117. Any accumulated count registered in difference counter 115 is readout once per month by the smart meter reader. That monthly count, if added to all the previous month's counts stored in the billing computer, becomes a parameter in the calculation of annual reliability, which can in turn be translated into a billing adjustment. Standby battery 116 powers clock 105, buffer memory 106 and difference counter 115, at a minimum, during a power failure.

Remote terminal 128, shown in FIG. 1A, conditions and then feeds smart-meter's demand message into a common linking transmission-line, such as a cable TV transmission-line. The conditioning allows that line to be simultaneously shared by hundreds of thousands of other smart-meters. Remote terminal 128 consists of power line carrier receiver 121 which receives each demand message from the smart meter and feeds it into burst memory 123. The content of memory 123 is then readout in a short-time burst, such as 20 microseconds. This is referred to as a data burst. The data burst is assigned a consumer unique time slot that is determined by timer 124. Timer 124 assigns a unique time slot to each consumer's data burst per frame-time interval, which is roughly one minute. This data burst then feeds modulator 126 which places the burst onto an RF carrier whose frequency is shown here as being a harmonic of a VCO found in timer 124.

Timer 124 has its framing pulse input picked off from the common transmission-line where it propagates on an RF carrier. It is shown as being picked off transmission-line 127 by directional coupler 129, detected by detector 129a and fed into timer 124.

FIG. 1B illustrates a method by which timer 124 could be realized. This illustrative timer receives a 60 Hz signal from the power line, splits the 60 Hz to feed SPDT electronic switch 130 and phase lock comparater element 134. Switch 130 is actuated by logic element 131 which senses the coincidence of inputted framing pulse and the transition of the last element in $2^n$ counter 132 as indicated by leading edge differentiator 132a.

When there is one input, instead of two that are in time coincidence feeding logic element 131, switch 130 switches to its fast timing position, said fast time being derived from counter 137. When there is time coincidence of the two inputs, switch 130 is switched to its 60 Hz port by logic element 131. This coincidence zeros any count and begins a new count with the next cycle of the 60 Hz which is coincident with the framing pulse. A running 60 Hz count is readout into multi-port-coincidence-gate array 133 where part of the assigned time slot number is hard wired in. When a match occurs between that count and that of the hard-wired pattern, an output pulse is generated. Differentiator 133a creates a spike coincident with the leading edge of that pulse. VCO 136 has its cycles counted by binary-counter 137. Whenever a match occurs between that registered binary count and the hard wired binary number, an output pulse is created. When coincidence occurs between the leading edge of the outputs from arrays 133 and 138, coincidence gate 135 fires one shot multivibrater 139 producing a pulse that equals the time duration allocated to one demand-message. This pulse releases half cycle pulses from VCO 136 through gate 140 which clocks the burst readout of the message stored in memory 123. VCO 136 is phase locked to the 60 Hz power-line signal by means of phase comparator 134. This phase lock makes said VCO frequency an exact multiple of the 60 Hz powerline signal and assures time coincidence of the spikes emanating from differentiators 133a and 138a. The VCO's frequency is shown here to be multiplied to its assigned cable TV carrier by frequency multiplier 141. The end result of all this processing is that a unique time slot can be assigned to each consumer that is determined by the binary number hard-wired into arrays 133 and 137. This approach, or some variation of it, could allow upwards of 1 million customers to continuously deliver their near real-time demand for electrical energy ultimately to exert control on the output of each supplier's generators.

The entire remote-terminal can be packaged into approximately a 10 cubic inch package which attaches onto the 110 VAC outlet that is nearest to the cable TV feed. The remote-terminal would derive its dc power from the 110 VAC and receives its information from the smart-meter via the RF carrier propagating along the 110 VAC wiring.

FIG. 2 pictorially illustrates a method for interrogating smart meters. It shows vehicle 203 with roof mounted antenna 204 driving on road 203a. Inside vehicle 203 is the smart meter reader. At roadside is a utility pole with transformer 205 from which power is fed to a consumer through feeder-line 202. The normally twisted power feeder-line is a poor radiator of RF energy. This line can be made into a more efficient radiator by inserting the RF circuits shown in FIG. 2a. The feeder line is RF short circuited by series resonant RF inductor 210 and capacitor 211, and the AC ground side wire is separated from its ground by parallel resonant RF inductor 212 and capacitor 213. The RF output from the smart meter feeds this line between the feedwires and ground. The result is a power feed line that also is fairly efficient at propagating and a radiating radio signals to passing vehicle meter readers from the smart meter's location.

FIG. 3A shows, in block diagram form, a data collection terminal-point that terminates each cable run that might be used in a greater electric power system area. In this 26 illustrative example three cable runs are assumed. They are referred to as a,b&c respectively. Each terminal point contains cable termination, 210, which feeds receiver 211 that detects the RF carrier modulated by the consumer demand message bursts. It also includes means for separating the near real-time demand number from the selected supplier's code in each demand message and for using the separated code to appropriately sort the demand numbers. This is done by separater 212 which inputs the demand message bursts and sorts each demand number destined for one of the three competing supplier's generator sites into one of three lines, by opening either gate 213a, 213b, or 213c, depending on the supplier code which preceeded the demand number. Each demand number is then accordingly fed into either running sum register 214a, 214b, or 214c. Each running sum accumulates for one minute, determined by clock 217. This clock then reads out and clears all running sum registers to receive the next near real-time interval's number stream. The output from sum register 214a is assigned, for this example, to supplier generator site 1. The running sum total for each one minute duration time is fed into transmitter 215's port $G_1$. That transmitter is connected to antenna 216 which is pointed towards site 1. Similarly the outputs from 214b and 214c are directed to sites 2 & 3 respectively.

FIG. 3B is a block diagram of the receiver terminal located at each generator site. Antenna 220, and receiver 221 receive the running sums from cable terminal-points a,b&c that are directed to the supplier whose generator is located at site 1, where the three running sum totals are added together in grand sum register 222. The grand sum total, for every minute in time is used to adjust that generator's voltage to make its real-time load equal to the near real-time demand from all of that supplier's consumers on cable runs a,b&c.

A sample demand message format is shown in FIG. 3C. It contains start message bytes 231, selected supplier identifying a bytes and near real-time demand magnitude bytes 232, and end-message bytes, 233.

Referring to FIG. 3A, the stream of data flowing from receiver 211 can serve a second purpose, that being to detect and localize faults throughout an entire service area. This detection and localization could include tampering with or a failure in any smart meter or remote terminal or in transmission line 210. It can also supply information for alarming and localizing breaks in the service area's electric power distribution system.

The data flowing out of said receiver 211 consists of a series of many narrow time slots that fill the near real-time demand frame. Each slot carries an individual consumer selected supplier code and the near real-time demand. By determining the number of time slots from the start of each time frame that a particular pattern disturbance is detected and correlating that slot's number to a table that connects slot numbers to street addresses, makes localization to the nearest consumer site, possible.

The type of pattern disturbance detected depends on the fault. Some scenarios are; 1) demand message interval is blank in one time slot, indicates most likely the fault is in remote terminal or is transmission-line-feed related, at that site; 2) supplier code is present but there are no demand bytes in one time slot, indicates a possible fault in the smart meter; 3) all slots are blank from one consumer site to the frame start, indicates a powerline break; all slots being blank from that site to frame's end indicates a break in the transmission-line.

I claim:

1. A metering/billing system that when introduced into an existing electric power company facilitates its transition away from present electric utility's cost based, fixed rate, regulated economic model into advanced market based, competitive deregulated economic models, is comprised of:

a multiplicity of smart meters each being comprised of:
means to measure energy consumption per long unit of time; means to sequentially store numbers representing said measured energy consumption, with said numbers being accumulated over a meter read cycle; means to measure time duration of any power outage condition and cumulatively store outage duration times over said meter read cycle; means to permanently store customer ID(identification) code and semi-permanently store current choice-of-supplier code; and a means to respond to properly addressed meter-reader radio commands by reading out said smart meter's stored information for transmission to a meter reader;

a number of smart-meter-readers each comprised of: means to initiate an interrogation of a particular smart meter; means to store information being received; means for generating a calendar-time tag for when each smart meter begins interrogation; and means to transfer said meter reader's information, gathered from many smart meter interrogations, to a billing computer; and said billing computer is programmed: to receive and appropriately segregate inputted meter reader relayed information; to assign a calendar-time number to each said long unit-of-time over a billing cycle, referencing each said calendar-time number from said meter reader's calendar-time tag; to use choice-of-supplier code to pick the appropriate supplier-provided look-up calendar-time/price listing and using said assigned calendar-time to select price from said listing; to compute each bill from said selected price, and energy consumed over each long unit-of-time interval; and to use cumulative power outage time data to generate an annualized reliability factor for each customer, from which said bill is appropriately adjusted.

2. System as recited in claim 1 wherein an ancillary system is added on to said system to support near real-time load balancing between competing suppliers sharing a common power distribution plant, said ancillary system is comprised of:

means to closely approximate real-time consumption by continuously running numbers that indicate energy consumption over short unit-of-time intervals, each said running number is made into a demand message by being joined with a current choice-of-supplier code;

means for transferring said running demand-messages from a smart meter location to a remote terminal located on customer's premises, in close proximity to any existing transmission-line feed, said remote terminal is comprised of;

means for time compressing each said demand message; means for inserting said time compressed demand message into an assigned time slot measured from the start of each said short unit-of-time interval; and means for modulating each resulting time-slotted-compressed-demand-message onto an RF carrier for transfer to a closeby transmission line, said transmission line has a terminal-point, said terminal-point is comprised of;

means to divide each terminal-point's output stream of running demand messages into several parallel supplier-specific running number streams; means to sum running numbers over a short unit-of-time intervals in each supplier-specific running number stream where each number represents measured consumption over each said short unit-of-time interval; and means for transmitting running sums from each terminal-point to each specified supplier's generator site;

wherein said generator site is comprised of in addition to other than generators:
  means to collect running sum-totals from each terminal-point in a power system's service area; means by which each supplier aggregates all received sum-totals into a running grand sum; and means to use said running grand sum to determine what near real time power is to be injected into said power system by each said supplier so the generator's output power will closely match the supplier's customer's real time demand.

3. System as recited in claim 2 wherein a connection between a smart meter and an existing cable television transmission line, which is used for a closeby transmission line, occurs via said remote terminal, said remote terminal is packaged to fit within a 110 VAC outlet, and is located in an outlet that is closest to an existing cable television feedline, and where the connection between the smart meter and remote terminal is made by modulating smart meter's demand messages onto an RF carrier that propagates over 60 Hz wiring, said RF carrier being received at said remote terminal.

4. System as recited in claim 1 wherein an overlapping phase-in and test period is provided for installation of a new metering-billing system, by including in the smart meter reader a means that sums all long unit-of-time energy consumption quantities received from each smart meter over a billing period, making the data compatible with conventional KWHs meter readings.

5. System as recited in claim 1 wherein the system includes a means for transferring information between a smart meter and a moving, over-the-road, smart-meter reader using overhead consumer power feedlines which are made into a more efficient RF radiating element by RF short circuiting all hot feed wires to each other at the meter end, and by breaking the actual-ground connection to ground side of said power feedline and inserting a parallel RF resonant circuit in series with the restored ground connection, and by transmitting and receiving radio signals via an input/output terminal comprised of said RF short circuited hot feedwires and actual ground.

6. A smart meter adapter which converts existing watt-hour meters into smart meters, is comprised of:
  means to count rotations of a spinning disc over long unit-of-time intervals
  means for storing long unit-of-time energy consumption counts in sequential order over an entire billing period;
  means for indicating cumulative time per billing cycle that available AC voltage level was unacceptable;
  means for identifying a customer connected with each smart meter;
  means for storing and reading out choice-of-supplier code,
  means for erasing & replacing said choice-of-supplier's code when so directed by a meter-reader, said meter reader also transmits new choice-of-supplier code to a designated smart meter on premises of a customer requesting a new supplier;
  means for transferring all stored smart meter information to a smart-meter reader, said transfer being triggered by receipt of correctly addressed request to execute.

7. Smart meter adapter as recited in claim 6 wherein a capability of said smart meter to support near real time load balancing is incorporated, said capability is comprised of:
  means to generate short unit-of-time running count numbers that register at the end of every short time interval, said numbers indicating energy consumption over short unit-of-time intervals,
  means for joining choice-of-supplier code to each said short-unit-of-time energy number, thus forming demand messages; and
  means for continuously transferring said demand messages from the smart meter's location to a remote terminal.

8. Smart meter adapter as recited in claim 6 wherein means for determining by how much, over a billing cycle, the energy consumption exceeded a given maximum during any 15 minute interval, is incorporated into said smart meter's functions.

9. Method for providing fault detection and fault localization in a system consisting of a plurality of smart meters, remote terminals, and a common transmission-line, is comprised of the following steps;
  receiving a sample of demand-messages coming from customers spread along said transmission-line;
  detecting any discontinuities in what would normally be a continuous series of demand-messages;
  identifying the discontinuity type, which would define the nature of the fault;
  identifying the time slot in which said discontinuity first appeared, as a first step in localizing said fault; and
  associating every said time slot with a street address through a listing, and picking out the address co-listed with said time slot to complete the fault localization.

10. Method for converting an existing electro mechanical watt-hour meter into a smart meter, comprising the steps of:
  inserting means for electronically marking each spinning disc rotation with a pulse;
  counting said pulses over predetermined long and short time intervals;
  transferring each said long interval count to a buffer memory where each count is stored in sequence, for an entire billing cycle;
  combining each said short-interval count number with a customer choice-of-supplier's code, said combination becoming a demand message, said choice-of-supplier code is stored in an EEPROM (electronically erasible programmable read only memory), and said demand message is modulated onto an RF carrier that propogates on 60 Hz wiring to reach a remote terminal;
  sensing and accumulating power outage duration time over a billing cycle;
  transferring out accumulated long interval counts, said long counts being readout to a smart meter reader in the reverse sequence that they were originally read-in, with consumer's ID, and power outage time, said transfer being executed by radio signals received and transmitted between the meter reader and the smart meter; and
  erasing and inserting a new choice-of-supplier code into said EEPROM when so indicated by the meter reader.

* * * * *